United States Patent [19]
Kosa et al.

[11] Patent Number: 5,364,810
[45] Date of Patent: Nov. 15, 1994

[54] METHODS OF FORMING A VERTICAL FIELD-EFFECT TRANSISTOR AND A SEMICONDUCTOR MEMORY CELL

[75] Inventors: Yasunobu Kosa; Howard C. Kirsch, both of Austin, Tex.

[73] Assignee: Motorola, Inc., Schaumburg, Ill.

[21] Appl. No.: 921,039

[22] Filed: Jul. 28, 1992

[51] Int. Cl.⁵ ..................... H01L 21/70; H01L 27/00
[52] U.S. Cl. ..................... 437/52; 437/29; 437/38; 437/59; 437/203
[58] Field of Search ............ 437/52, 29, 38, 59; 257/903, 379–381, 74, 904

[56] References Cited

U.S. PATENT DOCUMENTS

| | | | |
|---|---|---|---|
| 4,014,714 | 3/1977 | Murrmann et al. | 437/38 |
| 4,187,125 | 2/1980 | Feist | 437/38 |
| 4,530,149 | 7/1985 | Jastrzebski et al. | 29/571 |
| 4,554,572 | 11/1985 | Chatterjee | 357/42 |
| 4,713,678 | 12/1987 | Womack et al. | 253/304 |
| 4,845,537 | 7/1989 | Nishimura et al. | 357/23.4 |
| 4,864,374 | 9/1989 | Banerjee | 357/23.6 |
| 4,967,257 | 10/1990 | Inoue . | |
| 4,980,732 | 12/1990 | Okazawa | 357/23.5 |
| 4,982,266 | 1/1991 | Chaterjee | 257/74 |
| 4,987,090 | 1/1991 | Hsu et al. | 437/52 |
| 5,010,386 | 4/1991 | Groover | 357/42 |
| 5,021,355 | 6/1991 | Dhong et al. | 437/203 |
| 5,057,444 | 10/1991 | Fuse et al. | 437/35 |
| 5,072,276 | 12/1991 | Malhi et al. . | |
| 5,078,498 | 1/1992 | Kadakia et al. | 257/330 |
| 5,082,795 | 1/1992 | Temple | 437/41 |
| 5,122,846 | 6/1992 | Haken | 257/903 |
| 5,198,683 | 3/1993 | Sivan | 257/903 |
| 5,229,310 | 7/1993 | Sivan | 437/41 |
| 5,308,782 | 5/1994 | Mazure et al. | 452/52 |

OTHER PUBLICATIONS

Eklund, et al.; "A 0.5-$\mu$m BiCMOS Technology for Logic and 4 Mbit-class SRAM's"; IEDM; pp. 425–428 (1989).

Richardson, et al.; "A Trench Transistor Cross-Point DRAM Cell"; IEDM; pp. 714–717 (1985).

Primary Examiner—Olik Chaudhuri
Assistant Examiner—H. Jet Tsai
Attorney, Agent, or Firm—George R. Meyer

[57] ABSTRACT

The disclosure includes a vertical field-effect transistor (115) with a laterally recessed channel region (92), a vertical field-effect transistor (116) having a graded diffusion junction (31), a static random access memory cell (110) having a vertical n-channel field-effect transistor (116) and a vertical p-channel field-effect transistor (115) and methods of forming them. In one embodiment, a six-transistor static random access memory cell (110) has two pass transistors (111 and 114), which are planar n-channel field-effect transistors, two latch transistors (113 and 116), which are vertical n-channel field-effect transistors with drain regions having graded diffusion junctions (31), and two load transistors (112 and 115), which are vertical p-channel thin-film field-effect transistors having laterally recessed channel regions (92).

20 Claims, 8 Drawing Sheets

METHODS OF FORMING A VERTICAL FIELD-EFFECT TRANSISTOR AND A SEMICONDUCTOR MEMORY CELL

FIELD OF THE INVENTION

The present invention relates to the field of semiconductor devices, and in particular, to vertical field-effect transistors and semiconductor memory cells using the vertical field-effect transistors.

BACKGROUND OF THE INVENTION

Vertical field-effect transistors are used in many semiconductor devices, such as a dynamic random access memory (DRAM) or a static random access memory (SRAM), for example. The DRAM or SRAM typically includes a memory array having a plurality of memory cells. The size of the memory device is determined in part by the size of the memory cell. A smaller memory cell is typically faster and has a smaller number of defects compared to a larger cell. A number of emerging technologies use vertical field-effect transistors to reduce the size of the memory cell.

A complementary metal-oxide-semiconductor (CMOS) technology SRAM cell typically includes both n-channel and p-channel transistors. A CMOS technology SRAM cell typically does not include both vertical n-channel and vertical p-channel transistors within the semiconductor substrate. The vertical n-channel and vertical p-channel transistors may have an undesired electron flow between each other. In order to prevent the undesired electron flow between the vertical n-channel and vertical p-channel transistors, the transistors may be placed further apart, but this causes the memory cell to be larger. A complicated field isolation process may be needed to electrically isolate the transistors from one another, but the process may be difficult to perform or need additional processing steps.

Vertical field-effect transistors are more likely to have problems because of the manner in which the source and drain regions are formed compared to planar field-effect transistors. In a planar transistor, the channel region is typically covered by the gate electrode when the source and drain regions are formed. Many vertical field-effect transistors have source and drain regions that are ion implanted during the same processing step. The channel region may be exposed during the ion implanting step. Although the channel region may receive a fraction of the total doping, the doping of the channel region may significantly alter the electrical characteristics of the transistor. Lightly-doped-drain (LDD) structures, which are part of the source and drain regions, are typically formed using sidewall spacers or winged-gate structures and graded at least in the direction of current flow to reduce hot electron degradation of the gate dielectric layer near the drain region of the field-effect transistor. The LDD structure forms a more gradual electric field within the active region near the drain region to reduce hot electron damage to the gate dielectric layer near the drain region. Vertical field-effect transistors typically do not include LDD structures. Therefore, the vertical field-effect transistor is more likely to have reliability problems caused by hot electron degradation compared to the planar transistor with a LDD structure.

SUMMARY OF THE INVENTION

Embodiments of the present invention include a vertical field-effect transistor with a laterally recessed channel region, a vertical field-effect transistor having a source/drain region with a graded diffusion junction, and a static random access memory cell having a vertical n-channel field-effect transistor and a vertical p-channel field-effect transistor. One skilled in the art appreciates that a vertical transistor including a source/drain region with a graded diffusion junction or a laterally recessed channel region may be used in any type of semiconductor device, such as a memory device (DRAM, SRAM, etc.) or a logic device (microprocessor), for example. The present invention includes the memory cell, the vertical field-effect transistors, and methods of forming both. In one embodiment, a six-transistor static random access memory cell has two pass transistors that are planar n-channel field-effect transistors, two latch transistors that are vertical n-channel field-effect transistors with drain regions having graded diffusion junctions, and two load transistors that are vertical p-channel thin-film field-effect transistors having laterally recessed channel regions.

A device made in accordance with the present invention includes many benefits. The use of vertical n-channel and p-channel field-effect transistors at different elevations minimizes the memory cell area without a complicated field isolation process. A vertical field-effect transistor may include a graded diffusion junction. In an embodiment of the invention described below, the graded diffusion junctions are formed so that the junctions are self aligned to silicon trenches of vertical transistors and allows larger electrical currents to flow within the drain regions of the vertical transistors. The graded diffusion junctions may also form lightly doped drain structures for the vertical transistors and may reduce hot electron device degradation of the vertical transistors. The channel regions of another set of the vertical transistors are laterally recessed and are less likely to be doped during the formation of source and drain regions of those vertical transistors. Channel lengths for the vertical field-effect transistors of the embodiment are a function of the thickness of a layer in which the vertical field-effect transistor is formed. Channel lengths for planar field-effect transistors typically have channel regions that are dependent on lithographic methods, which are typically limited by the resolution limit of the lithographic method used. The channel length for the vertical field-effect transistor may be smaller and better controlled compared to planar transistors because a layer may have a thickness smaller than the resolution limit of many lithographic methods and thickness control of a layer is typically than dimensional control of those lithographic methods.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
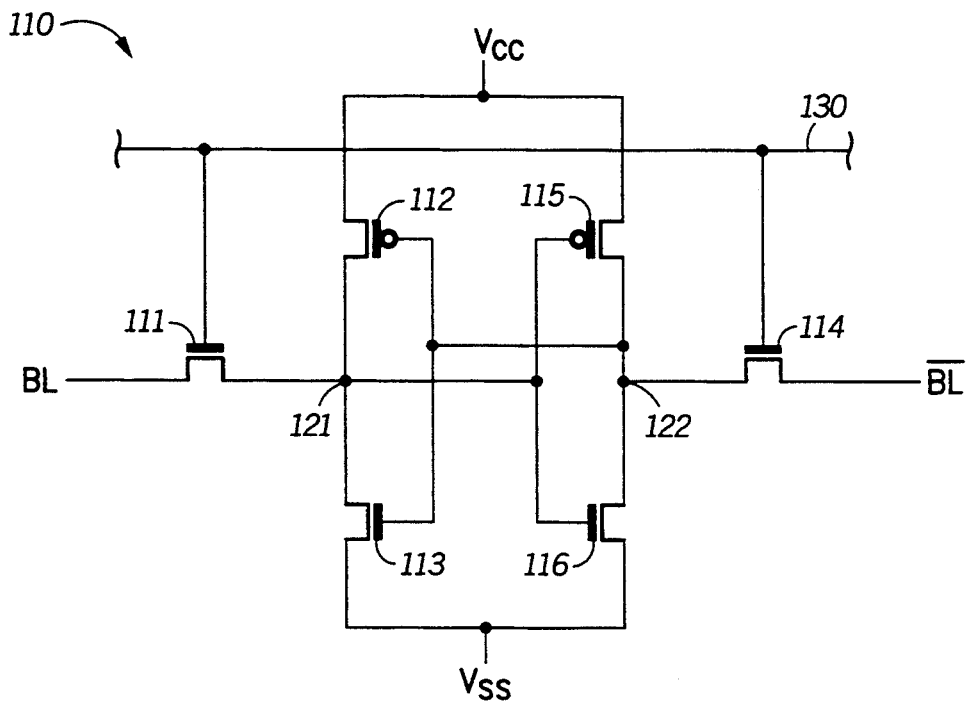
FIG. 1 includes an illustration of a prior art circuit diagram of a six-transistor static random access memory cell.

Embodiments of the present invention include a vertical field-effect transistor with a laterally recessed channel region, a vertical field-effect transistor having a source/drain region with a graded diffusion junction, and a static random access memory cell having a vertical n-channel field-effect transistor and a vertical p-channel field-effect transistor. One skilled in the art appreciates that a vertical transistor including a source/drain region with a graded diffusion junction or a laterally recessed channel region may be used in any type of semiconductor device, such as a memory device (DRAM, SRAM, etc.) or a logic device (microprocessor), for example. The present invention includes the memory cell, the vertical field-effect transistors, and methods of forming both. In one embodiment, a six-transistor static random access memory cell has two pass transistors that are planar n-channel field-effect transistors, two latch transistors that are vertical n-channel field-effect transistors with drain regions having graded diffusion junctions, and two load transistors that are vertical p-channel thin-film field-effect transistors having laterally recessed channel regions.

A device made in accordance with the present invention includes many benefits. The use of vertical n-channel and p-channel field-effect transistors at different elevations minimizes the memory cell area without a complicated field isolation process. A vertical field-effect transistor may include a graded diffusion junction. In an embodiment of the invention described below, the graded diffusion junctions are foraged so that the junctions are self aligned to silicon trenches of vertical transistors and allows larger electrical currents to flow within the drain regions of the vertical transistors. The graded diffusion junctions may also form lightly doped drain structures for the vertical transistors and may reduce hot electron device degradation of the vertical transistors. The channel regions of another set of the vertical transistors are laterally recessed and are less likely to be doped during the formation of source and drain regions of those vertical transistors. Channel lengths for the vertical field-effect transistors of the embodiment are a function of the thickness of a layer in which the vertical field-effect transistor is formed. Channel lengths for planar field-effect transistors typically have channel regions that are dependent on lithographic methods, which are typically limited by the resolution limit of the lithographic method used. The channel length for the vertical field-effect transistor may be smaller and better controlled compared to planar transistors because a layer may have a thickness smaller than the resolution limit of many lithographic methods and thickness control of a layer is typically than dimensional control of those lithographic methods.

The embodiments described below illustrate a few embodiments of the present invention. The examples are meant to be illustrative and not limiting. One skilled in the an appreciates that the embodiments described below may be changed without affecting the spirit or scope of the present invention.

EXAMPLE 1

FIG. 1 includes a circuit diagram of a six-transistor static random access memory cell 110. The memory cell 110 includes six field-effect transistors 111–116 having sources, drains, and gates, wherein the memory cell 110 has three pairs of transistors: two "pass" transistors 111 and 114; two "pull-down" or "latch" transistors 113 and 116; and two "pull-up" or "load" transistors 112 and 115. Within each pair, the transistors are similar to one another. The pass transistors 111 and 114 have first source/drain regions and second source/drain regions. The first source/drain regions are connected to two separate bit lines, wherein a first bit line has inverted logic compared to a second bit line, which means the first bit line has a relatively high potential compared to the second bit line, or the second bit line has a relatively high potential compared to the first bit line. The pass transistors 111 and 114 have their gates connected to a word line. The latch transistors 113 and 116 have their sources connected to Vss that is typically at about ground potential when the cell is operating. The load transistors 112 and 115 have their sources connected to Vcc that is typically at a potential of about 3–5 volts when the cell is operating. The memory cell includes a first storage node 121, which is where the second source/drain region of pass transistor 111 and the drain regions of the load transistor 112 and the latch transistor 113 are electrically connected to one another, and a second storage node 122, which is where the second source/drain region of pass transistor 114 and the drain regions of the load transistor 115 and the latch transistor 116 are electrically connected to one another. As used hereinafter, transistors 111–113 are associated with the first storage node 121, and transistors 114–116 are associated with the second storage node 122. The transistors are further interconnected to one another within the memory cell as shown in FIG. 1.

Figure 2:
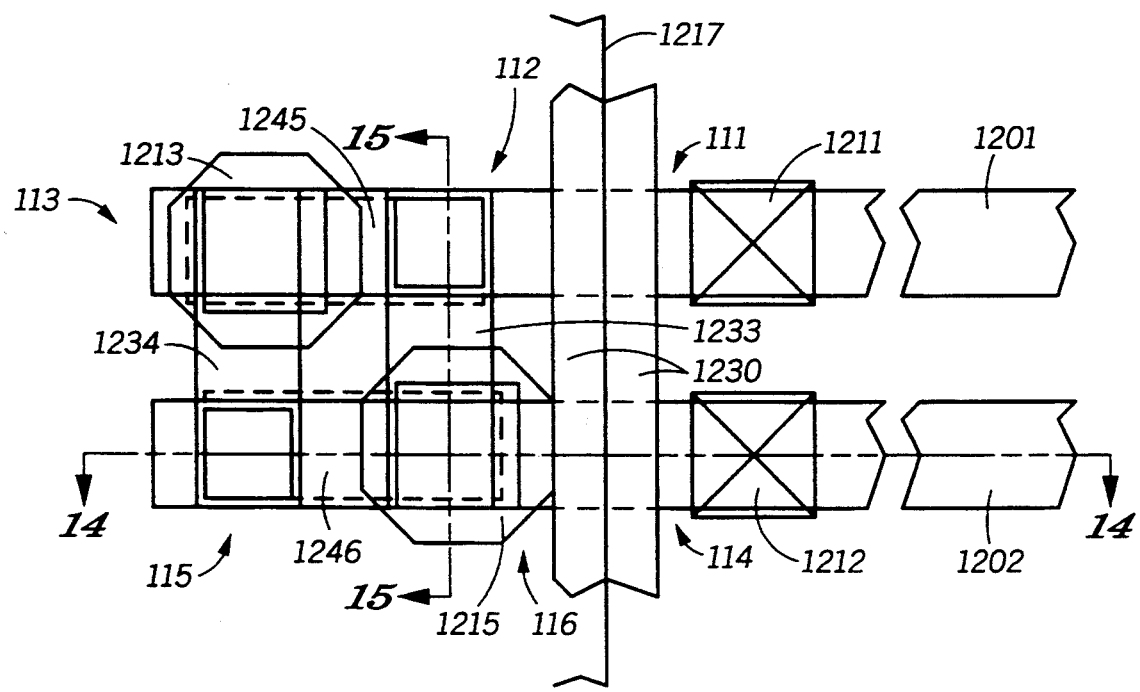
FIG. 2 includes an illustration of a top view of a static random access memory cell formed in accordance with an embodiment of the present invention.
Figure 14:
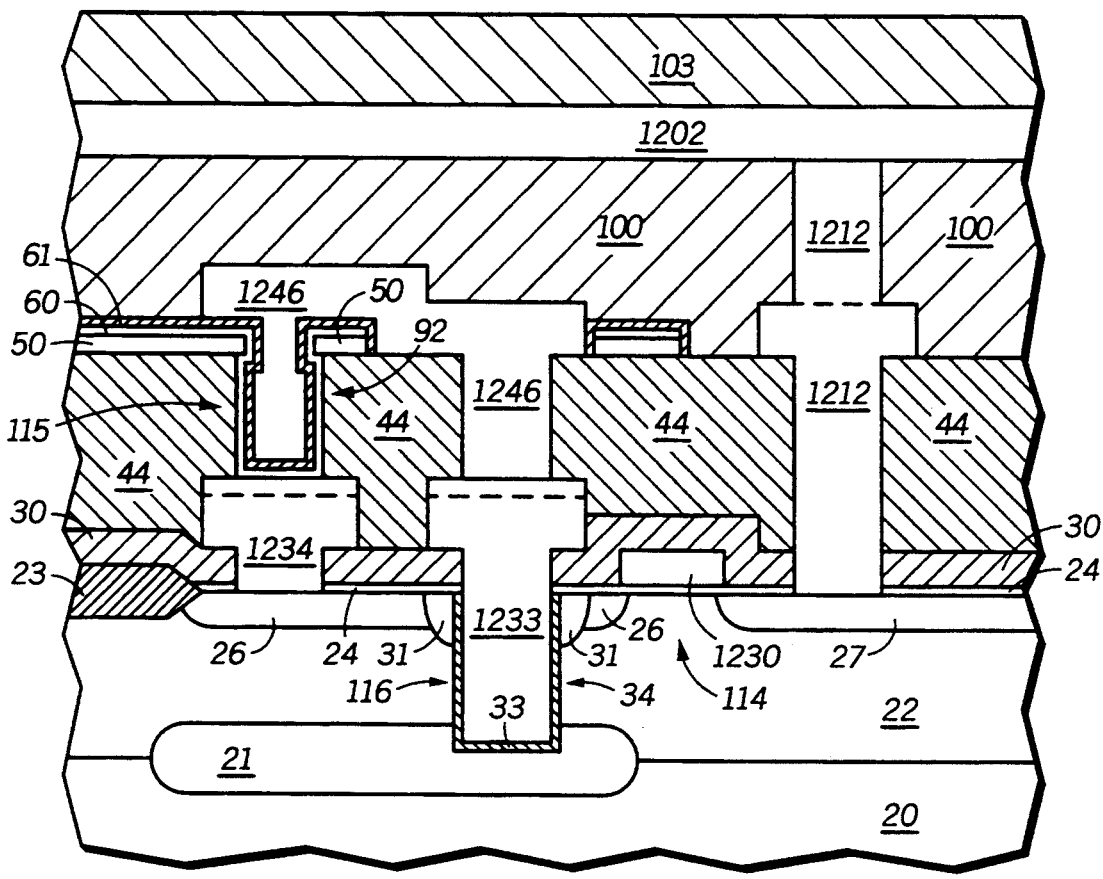
FIG. 14–15 include illustrations of cross sectional views of the FIG. 2 memory cell.
Figure 15:
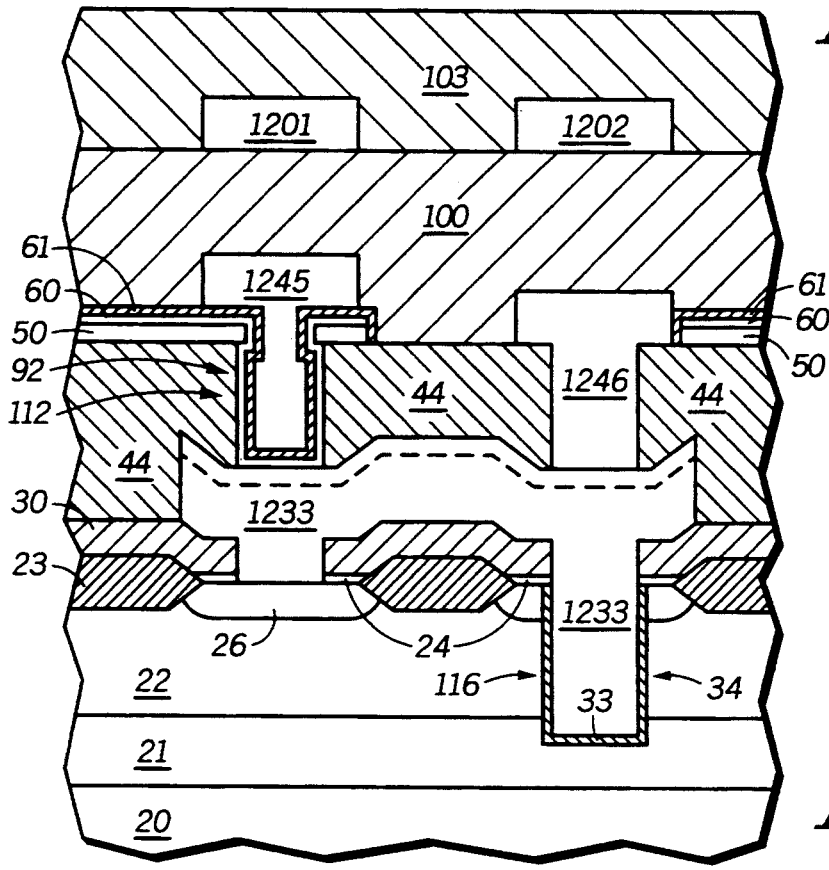

FIG. 2 includes a top view of a six-transistor, complementary metal-oxide-semiconductor technology static random access memory cell in accordance with one embodiment. The memory cell occupies less substrate area by using both vertical n-channel transistors and vertical p-channel transistors. The memory cell includes the transistors 111–116, wherein the pass transistors 111 and 114 are planar n-channel field-effect transistors, the latch transistors 113 and 116 are vertical n-channel field effect transistors, and the load transistors 112 and 115 are vertical p-channel thin-film field-effect transistors. The memory cell is generally organized into two rows of transistors, wherein the transistors 111–113 generally lie beneath bit line 1201, and the transistors 114–116 generally lie beneath bit line 1202. The bit lines 1201 and 1202 are connected to the first source/drain regions of the pass transistors 111 and 114 by bit lines contacts 1211 and 1212, respectively. The gate electrodes of the two pass transistors 111 and 114 are part of word line 1230. The gate electrode of the latch transistor 116 is connected to the drain region of the load transistor 112 by item 1233. The gate electrode of the latch transistor 113 is connected to the drain region of the load transistor 115 by item 1234. Items 1233 and 1234 are generally parallel to the word line 1230. The source regions of the load transistors 112 and 115 are electrically connected to one another by a silicon layer that covers the memory cell to the left of the center of the word line 1230 (as indicated by item 1217) except for octagons 1213 and 1215. The silicon layer is electrically connected to Vcc (not shown) that is at a potential in a range of about 3–5 when the memory cell is operating. The gate electrodes of the load transistor 112 and the latch transistor 113 are connected by item 1245, and the gate electrodes of the load transistor 115 and the latch transistor 116 are connected by item 1246. FIG. 14 and 15 are cross sectional views of the memory cell as indicated by cross sectioning lines 14—14 and 15—15, respectively, as shown in FIG. 2. FIG. 14 and 15 include cross references between the elements used to form the memory cell and FIG. 2 that includes the top view of the interconnections of the transistors within the memory cell.

Figure 3:
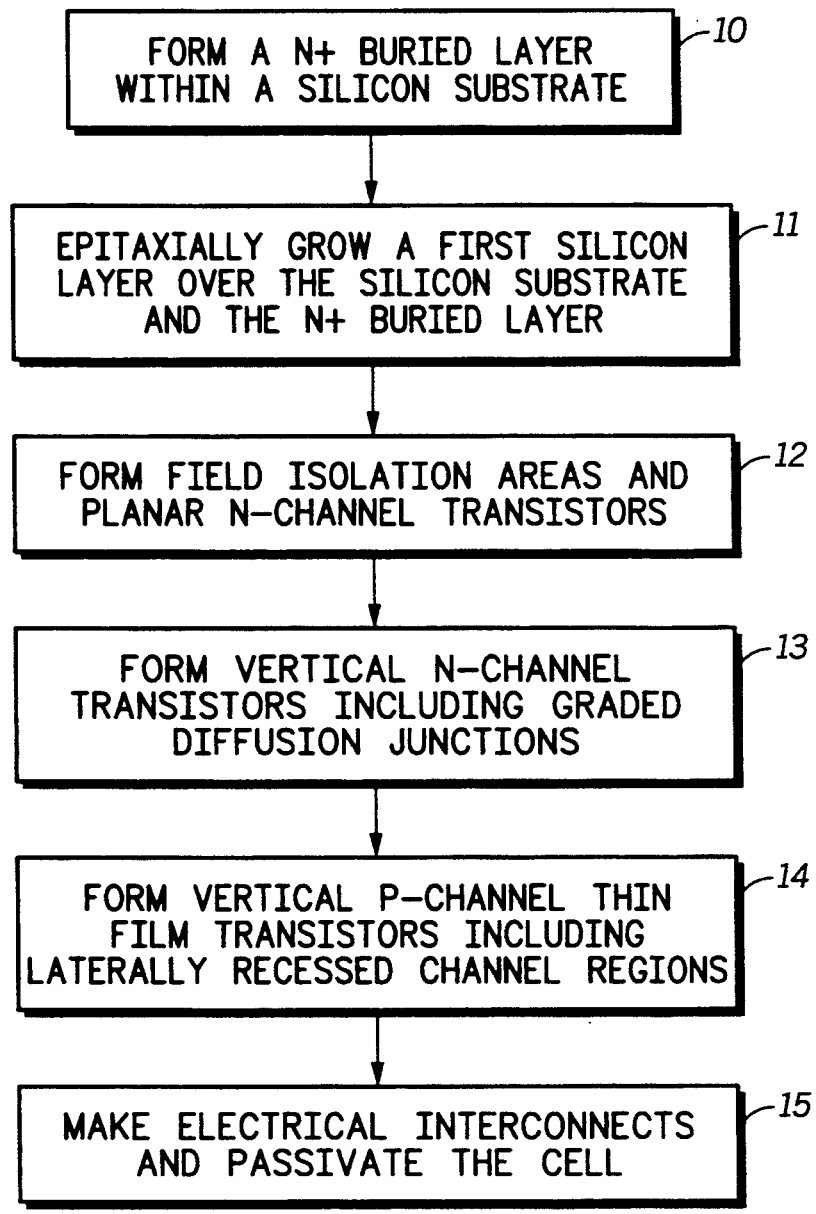
FIG. 3 includes a flow chart of processing steps used to form the memory cell of FIG. 2.

FIG. 3 includes a process flow chart for a process flow used to form the memory cell illustrated in FIG. 2. A N+ buried layer is formed within a monocrystalline silicon substrate (silicon substrate) (step 10). A first silicon layer is epitaxially grown over the silicon substrate and the N+ buried layer (step 11). Field isolation regions and the planar n-channel transistors that are the pass transistors are formed within the first silicon layer (step 12). The vertical n-channel field-effect transistors that are the latch transistors of the memory cell are formed within trenches of the first silicon layer. The vertical n-channel field-effect transistors of the embodiment include drain regions with graded diffusion junctions (step 13). Vertical p-channel thin-film field-effect transistors that are the load transistors of the memory cell are formed within a patterned insulating layer that lies over the first silicon layer (step 14). The vertical p-channel field-effect transistors of the embodiment include laterally recessed channel regions. Electrical interconnects to the memory cell are made, and the memory cell is passivated (step 15). Below is a detailed description of the process steps performed to form the memory cell of this embodiment. FIG. 4–13 illustrate cross sectional views of a portion of the memory cell a generally depicted along cross sectioning line 14—14 of FIG. 2.

Figure 4:
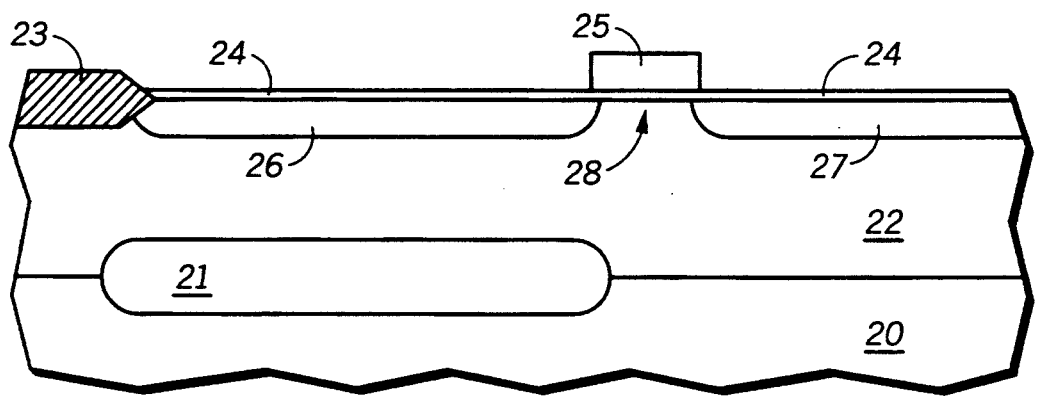
FIG. 4–13 include illustrations of cross sectional views of a portion of a semiconductor substrate at various process steps in forming the FIG. 2 memory cell.

FIG. 4 includes a (100) lightly p-type doped monocrystalline silicon substrate 20. A first masking layer (not shown) is formed over the substrate 20. The first masking layer includes a patterned silicon dioxide layer and a first masking layer opening. The substrate is ion implanted with arsenic to form a doped region is formed within the substrate beneath the first masking layer opening. A thermal step is performed to activate and diffuse the dopant to form a N+ buried layer 21. The thermal step also grows some silicon dioxide over the N+ buried layer 21. The masking layer and silicon dioxide over the N+ buried layer 21 are then removed, and a first silicon layer 22 about 1.4 microns thick is formed over the substrate 20 and the N+ buried layer 21 by epitaxially depositing silicon using dichlorosilane with boron doping to produce a lightly p-type doped monocrystalline silicon layer. During the epitaxial growth step and subsequent thermal steps, part of the N+ buffed layer 21 diffuses into the first silicon layer 22, but the N+ buried layer 21 remains adjacent to the lower surface of the first silicon layer 22.

A field isolation region 23 is formed using a conventional local oxidation of silicon field isolation process. Referring to FIG. 2, the field isolation region lies between the first storage node transistors (111–113) and the second storage node transistors (114–116). The field isolation region 23 may also be used to electrically isolate the memory cell from other regions (not shown) of the substrate 20. A first gate dielectric layer 24 is formed by thermally oxidizing the first silicon layer 22 within the active region as shown in FIG. 4. A first conductive member 25, which is part of the word line 1230, is formed over the first gate dielectric layer 24. The first conductive member 25 is formed by depositing a silicon layer over the gate dielectric layer 24 and heavily doping the first silicon layer with phosphorus. The silicon layer is patterned using conventional lithographic and etching techniques to form the first conductive member 25 that is about 0.5 micron wide. The first conductive member 25 forms part of the word line 1230. The substrate is heavily doped with arsenic to form second doped regions 26 and third doped regions 27 both within the first silicon layer 22. FIG. 4 includes one of the second doped regions 26 and one of the third doped regions 27. Another second doped region (not shown) and another third doped region (not shown) similar to those shown in FIG. 4 are formed within the memory cell. The pass transistors, which are planar n-channel transistors, have been formed and each includes part of the first conductive member 25, part of the second doped region 26, and part of the third doped region 27.

Figure 5:
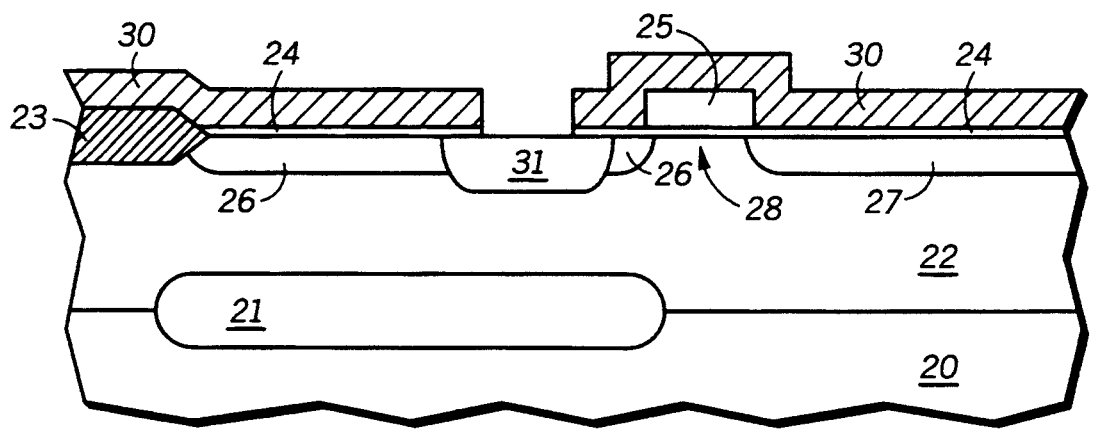

A second masking layer 30 is formed over the substrate. The second masking layer is formed by steps including depositing a silicon dioxide layer about 1700 angstroms thick and patterning the silicon dioxide layer and the first gate dielectric layer 24 for a first time to form the second masking layer 30 having openings, wherein each opening exposes a portion of each second doped region 26 where the trenches for the latch transistors 113 and 116 are subsequently formed. The substrate is heavily doped with phosphorus and then annealed to activate and drive the phosphorous ions and form graded diffusion junctions 31. FIG. 5 illustrates one of the graded diffusion junctions 31.

Figure 6:
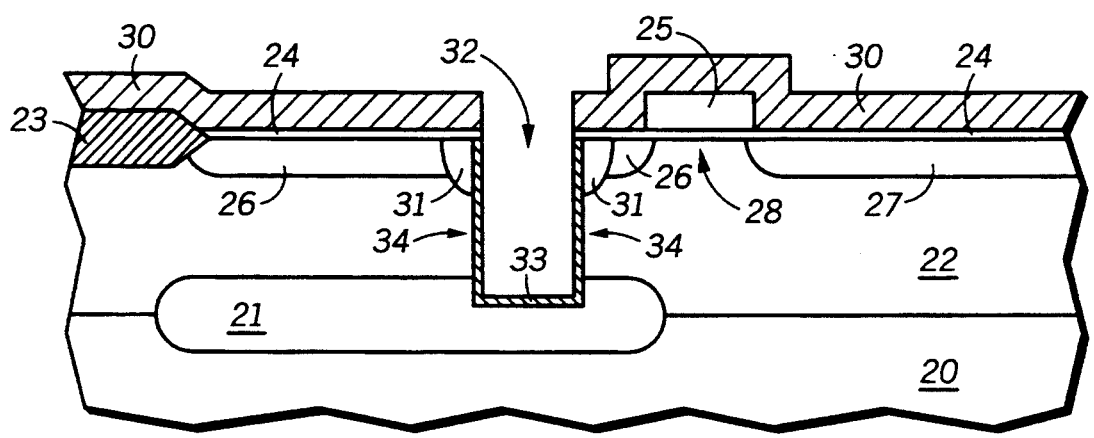

Using the second masking layer 30 as a silicon etch mask, the first silicon layer 22 is selectively etched to form trenches 32, wherein each trench 32 has a bottom, top, and walls and has a depth of about 1.4 microns as shown in FIG. 6. An active region for each n-channel vertical transistor includes the N+ buried layer 21 and a graded diffusion junction 31, and a channel region 34, which is that portion of the first silicon layer 22 lying between the N+ buffed layer 21 and the graded diffusion junction 31. In the finished memory cell 110, the graded diffusion junction extends about 0.4 micron from the upper surface of the first silicon layer 22. A second gate dielectric layer 33 is formed adjacent the walls and bottoms of the trenches 32 by thermally growing silicon dioxide from silicon that lies adjacent the trenches 32 as shown in FIG. 6.

Figure 7:
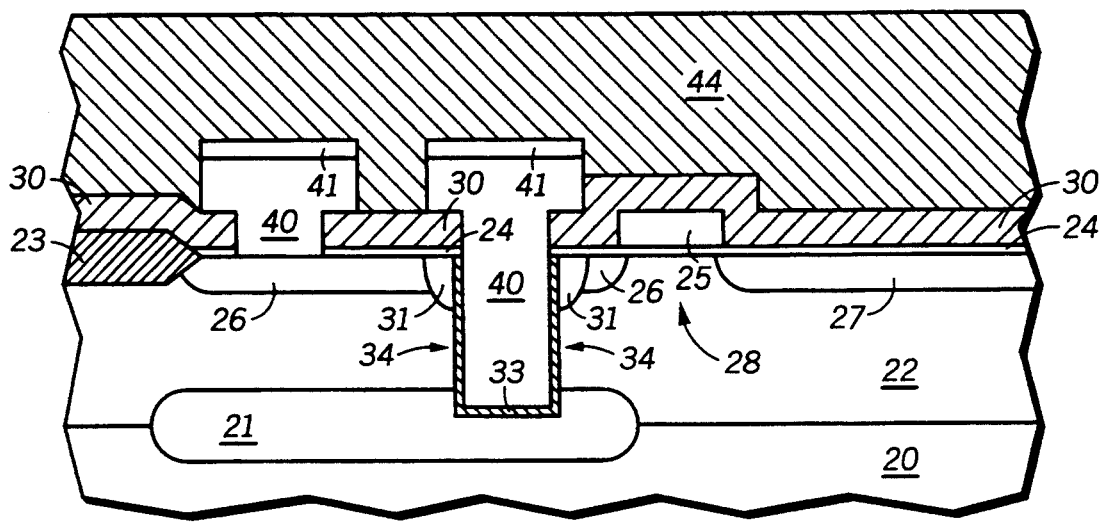

The second masking layer 30 is patterned for a second time to form second openings through the second masking layer 30. The second openings expose portions of the second doped regions 26 over which a load transistor is subsequently formed. A second silicon layer 40 that is in-situ doped with arsenic is deposited over the second masking layer 30 and within the trenches 32 and second openings of the second masking layer. A titanium silicide layer 41 is formed over the second silicon layer 40 from a portion of the second silicon layer 40. The combination second silicon layer 40 and titanium silicide layer 41 is patterned using conventional methods to form second conductive members. The latch transistors, which are vertical n-channel transistors, have been formed, wherein each latch transistor has a source region that includes a portion of the N+ buried layer 21, the channel region 34, a drain region that includes one of the graded diffusion junctions 31, the second gate dielectric layer 33, and the gate electrode, which is a portion of one of the second conductive members that includes the second silicon layer 40 and the titanium silicide layer 41. Each second conductive member electrically connects the gate electrode of a latch transistor associated with one storage node with a second doped region 26 associated with the other storage node. FIG. 7 includes an illustration of one of the latch transistors and both of the second conductive members that each include a silicon layer 40 and a titanium silicide layer 41.

Figure 8:
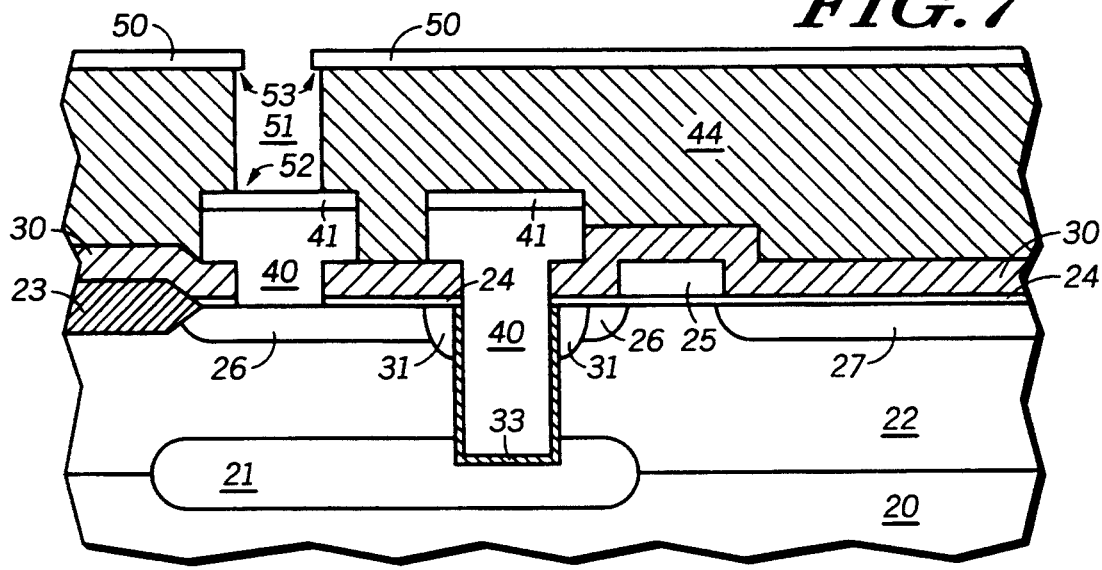
Figure 9:
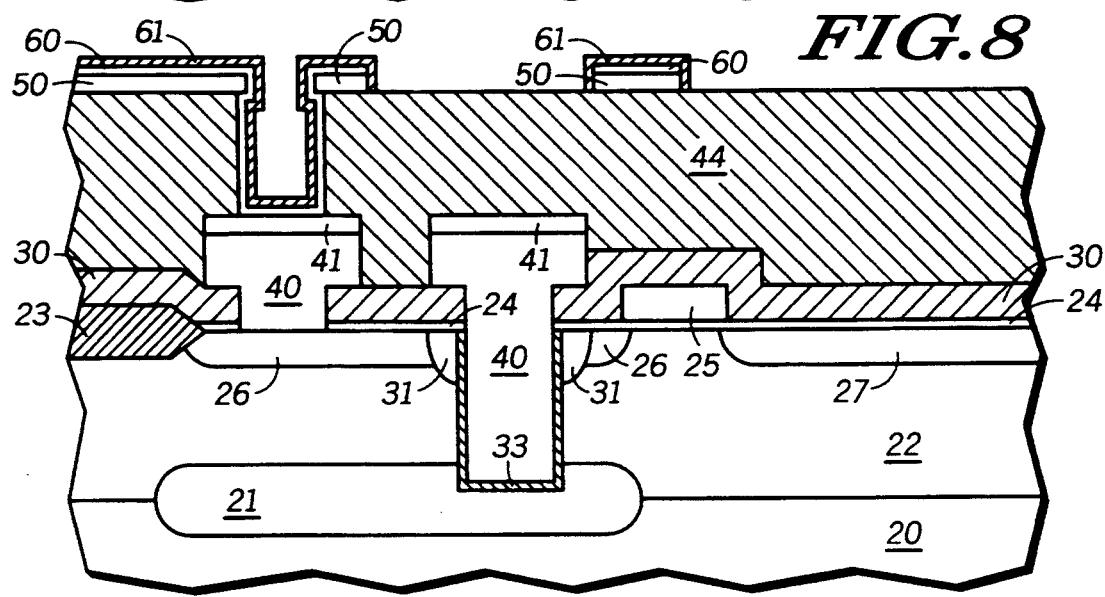

A first insulating layer 44 having a planar surface and comprising silicon dioxide is formed over the second masking layer 30 and the titanium silicide layer 41 of the second conductive members as shown in FIG. 7. The first insulating layer is about 1.2 microns thick over the titanium silicide layer 41. Referring to FIG. 8, a third masking layer 50 is formed over the first insulating layer 44 by depositing silicon to a thickness of about 800 angstroms and patterning the silicon using conventional methods. The third masking layer 50 has third masking layer openings, wherein each third masking layer exposes a portion of the first insulating layer 44 where a load transistor is subsequently formed. Each third masking layer opening has a center, and a line through the center and generally normal to the substrate surface forms a lateral centerline for the third masking layer opening. The exposed first insulating layer 44 is anisotropically etched to form openings through the first insulating layer 44 that extends to the surface 52 of the titanium silicide layer 41 of a second conductive member. The first insulating layer 44 is then isotropically etched using a buffered oxide etchant so that the second masking layer 50 is undercut (as shown by arrows 53) by about 200 angstroms on each side of the third masking layer openings to form the patterned first insulating layer including first insulating layer openings 51 having generally vertical walls. A second silicon layer 60 about 450 angstroms thick is formed by depositing silicon in-situ doped with phosphorus over the first insulating layer 44, the third masking layer 50, and along the bottom and walls of the first insulating layer openings 51. The second silicon layer 60 and the third masking layer 50 are patterned using conventional methods to remove those portions of the two layers 50 and 60 that lie within the octagons 1213 and 1215 and to the right of the center of word line 1230 as illustrated in FIGS. 2 (item 1217) and 9. A third gate dielectric layer 61 about 200 angstroms thick is thermally grown from the second silicon layer 60 and the exposed sides of the third masking layer 50 as shown in FIG. 9.

Figure 10:
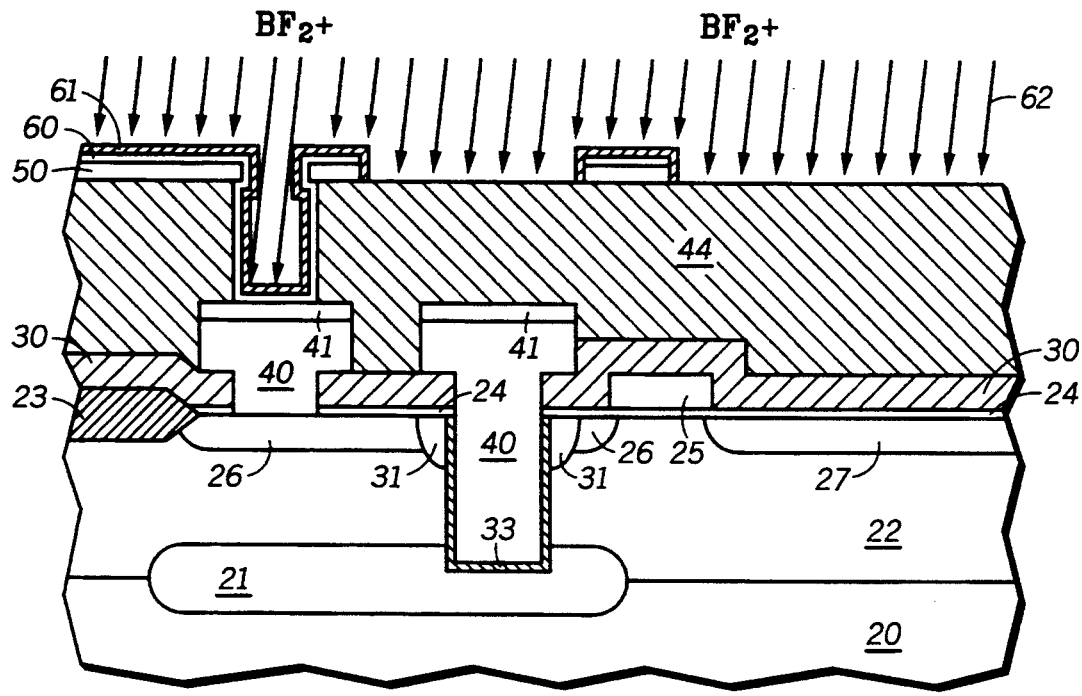
Figure 11:
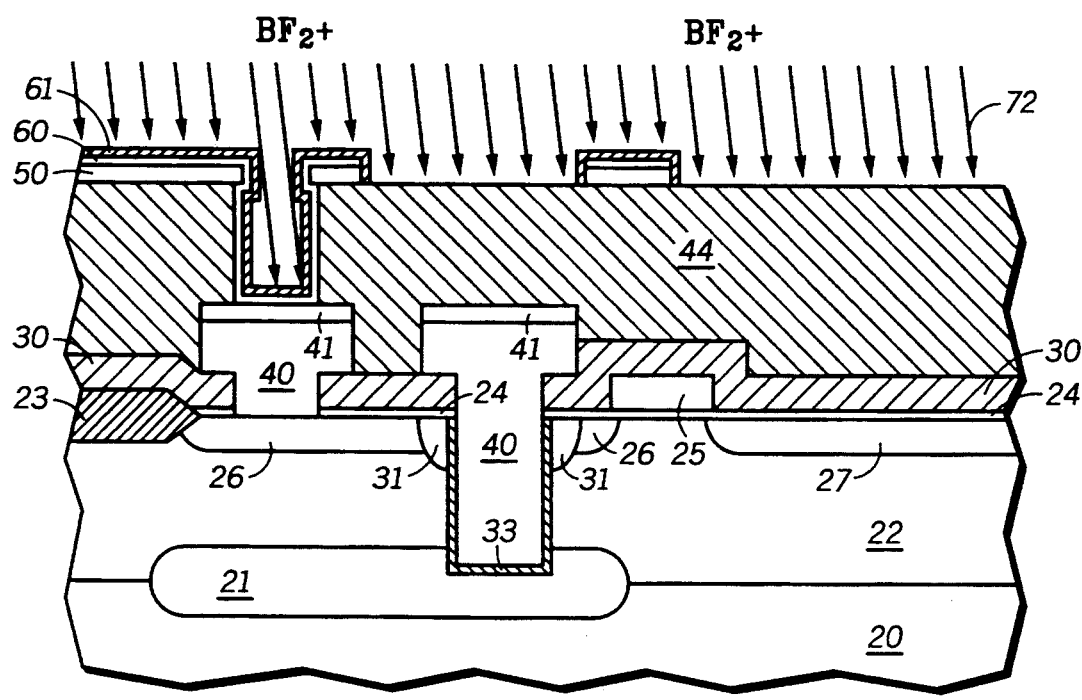

The second silicon layer 60 is selectively doped to form source regions and drain regions of the load transistors and to electrically connect the source regions of the load transistors together. The selective doping needs to be performed so that the second silicon layer 60 is heavily doped along the bottom and adjacent the top of the first insulating layer openings 51 to make the doped second silicon layer 60 conductive, while virtually preventing dopant from entering that portion of the second silicon layer 60 lying along the walls of the first insulating layer openings 51, which is where the channel regions of the load transistors are subsequently located. The ion implant is performed at a nominal substrate tilt angle of about zero degrees using a parallel scan ion implanter, such as the Extrion 220 ion implanter made by Varian Associates, for example. The substrate tilt angle is a measure of the angle at which the ions travel towards the substrate, wherein a substrate tilt angle of zero degrees corresponds to a direction normal to the surface of the substrate. Although the ion implanting step is performed at nominally zero degrees, the actual substrate tilt angle may vary by as much as ±0.5 degrees. The second silicon layer 60 is laterally recessed along the sides of the first insulating layer openings 51 to virtually prevent doping the second silicon layer 60 during the formation of the source ,and drain regions of the load transistors. The isotropic etching of the first insulating layer 44 when forming openings 51 is determined in part by the actual substrate tilt angle during the ion implantation of the second silicon layer 60. The second silicon layer 60 is selectively doped by ion implanting boron difluoride ions at an energy of about 40 kiloelectron volts to a dose of about 5E15 ions per square centimeter. The substrate is ion implanted in four segments, wherein the substrate receives about a quarter of the total dose and is then rotated about 90 degrees along a plane that is generally parallel to the substrate surface. FIGS. 10 and 11 include illustrations of the first and third segments of the ion implant, which are depicted by the arrows 62 and 72 that illustrate a slight non-zero implant angle as seen from the substrate surface.

Figure 12:
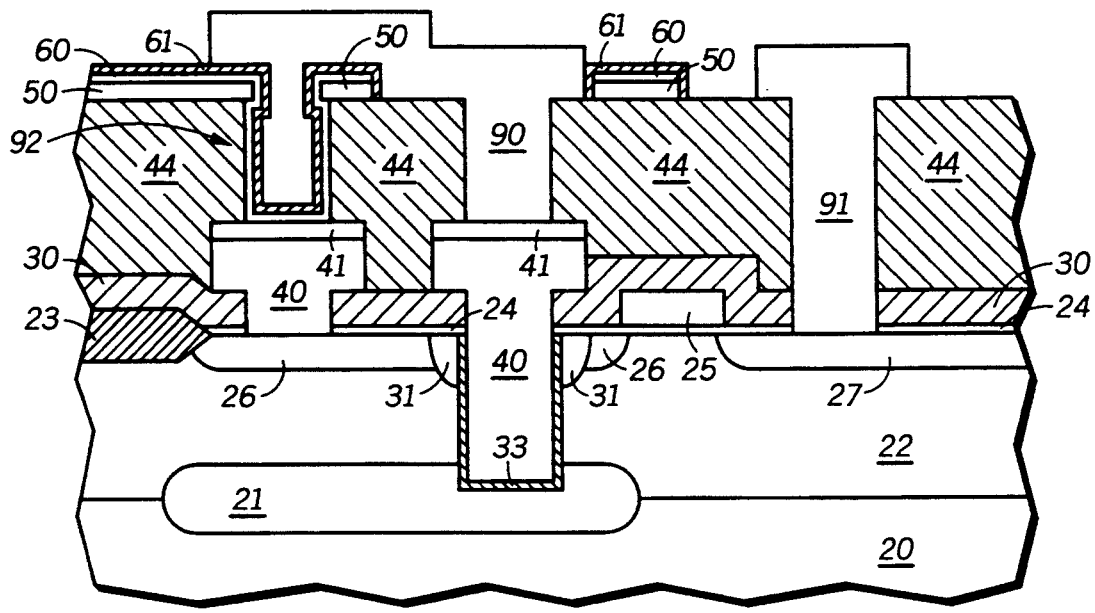

The first insulating layer 44 is patterned for a second time to form openings through the first insulating layer that expose 1) the titanium silicide layer 41 of the second conductive members that lie above the latch transistors and 2) portions of the third doped regions 27. Third conductive members 90 and 91 are formed by depositing a silicon layer that is in situ doped with arsenic and patterning the silicon layer using conventional methods as shown in FIG. 12. The third conductive members 91 contacts the third doped regions 27. Portions of the third conductive members 90 form the gate electrodes of the load transistors. Each load transistor is a vertical p-channel thin-film transistor having a source region that includes that a portion of the second silicon layer 60 lying along the bottom of a first insulated layer opening 51, a source region that includes a portion of the masking layer 50 and pan of the second silicon layer 60 adjacent the top of the same first insulating layer opening 51, a laterally recessed channel region 92 that includes a portion of the second silicon layer 60 adjacent the walls of the first insulating layer opening 51, the third gate dielectric layer 61, and a gate electrode, which is a portion of a second conductive member 90. Each third conductive member 90 also electrically connects the gate electrodes of the latch and load transistors associated with the same storage node.

Figure 13:
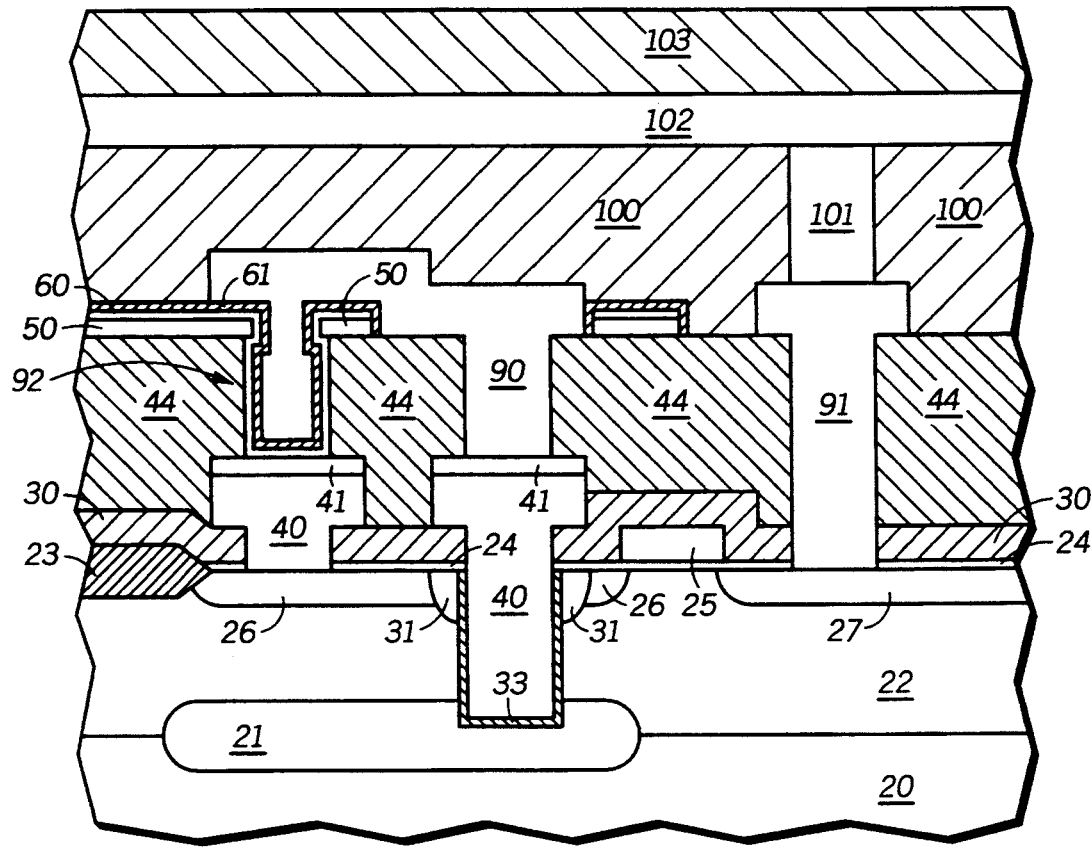

A second patterned insulating layer 100 is formed over the third conductive members 90 and 91 as shown in FIG. 13. The second patterned insulating layer 100 is formed by depositing a borophosphosilicate glass layer and planarizing and patterning the glass layer to form the patterned second insulating layer 100 including contact openings that expose the third conductive members 91. Additional contact openings (not shown) may be formed to connect the N+ buffed layer 21 to a Vss electrode (not shown), the first conductive member 25 to a column decoder (not shown), and the second silicon layer 60 to a Vcc electrode (not shown). The openings are filled with contact plugs 101 including tungsten. Interconnect members 102 are formed by depositing an aluminum layer over the patterned second insulating layer 100 and the contact plugs 101 and then patterning the aluminum layer. Each interconnect member 102 is pan of a bit line that makes an electrical connection with one of the doped third regions 27 via one of the contact plugs 101 and one of the third conductive members 91. The substrate is then covered by an oxynitride passivation layer 103 to form a finished memory cell.

FIGS. 14 and 15 are cross sectional views of the memory cell formed in accordance to the previously described steps and indicated in FIG. 2 by cross sectioning lines 14—14 and 15—15, respectively. FIG. 14, which is similar to FIG. 13, and FIG. 15 illustrate how some of the layers and elements correspond to the top view of the memory cell shown in FIG. 2. Referring to FIG. 14, the bit line 1202 makes electrical connection with the third doped region 27 via the bit line contact 1212. The portion of the bit line contact 1212 that lies above the dashed line corresponds to the tungsten plug 101 and the portion that lies below the dashed line corresponds to the third conductive member 91 both of FIG. 13. The word line 1230 includes the first conductive member 25 of FIG. 13. The second conductive members 1233 and 1234 connect the gate electrodes of the latch transistors 113 and 116 to the drain regions of the load transistors 115 and 112, respectively. The portions of the second conductive members 1233 and 1234 that lie above the dashed lines corresponds to the titanium silicide layer 41 and the portions that lies below the dashed line corresponds to the doped silicon layer 40 both of FIG. 13. The third conductive member 1246 connects the gate electrodes of the transistors 115 and 116 to one another. The second storage node (see item 122 of FIG. 2) includes the second doped region 26, the graded diffusion junction 31, the second conductive member 1233, and that portion of the second silicon layer 60 that lies along the bottom of the first insulating layer opening. FIG. 15 includes the bit lines 1201 and 1202. The second conductive member 1233 electrically connects the third conductive member 1246 to the second doped region 26 that lies below the bit line 1201. In this manner, the gate electrodes of the latch and load transistors associated with second storage node are electrically connected the first storage node. The combination of the second conductive member 1234 (shown in FIG. 14) and the third conductive member 1245 forms a similar electrical connection.

BENEFITS AND FABRICATION OPTIONS OF EXAMPLE 1

A device made in accordance with this example includes many benefits. The memory cell occupies an area of the substrate in a range of about 24–34 times the square of the smallest feature dimension. The smallest feature dimension of the embodiment given is about 0.5 micron (the width of the first conductive member). Therefore, the memory cell area may be about six square microns. The memory cell area decreases even further if a smaller feature dimension is used. Currently, optical lithographic methods using phase-shifting masks may achieve a dimension as low as 0.2 microns and may allow the formation of a memory cell occupying an area slightly less than one square micron. The memory cell area is achieved by using vertical transistors for both the latch (n-channel) and the load (p-channel) transistors. The latch and load transistors are located at different elevations and allows the transistors to be placed close together as seen from a top view of the memory cell. If the latch and load transistors were both fabricated within the first silicon layer 22, the transistors would either need to be placed further apart or a complicated isolation process would be needed to keep the transistors electrically isolated from one another.

Referring to FIG. 6, the graded diffusion junctions 31 are self aligned to the trenches 32 of the latch transistors because the same openings within the second masking layer 30 are used during both the doping step that forms the graded diffusion junctions 31 and the trench formation step. The self-aligned graded diffusion junction 31 has an additional benefit in that larger electrical currents may flow through the doped regions near the top of the trench of the latch transistors 113 and 116. The graded diffusion junctions 31 may also forms lightly doped drain structures for the latch transistors and may reduce hot electron device degradation of the latch transistors.

The second conductive members 1233 and 1234 form electrical connections between the second doped regions 26 that are n-type doped and the drain regions of the load transistors 112 and 115 that are p-type doped. The titanium silicide layer 41 of the second conductive members 1233 and 1234 is a conductive barrier layer that virtually prevents dopant migration between the n-type doped regions 26 and the p-type doped drain regions of the load transistors 112 and 115. The conductive barrier layer may comprise other materials, such as cobalt silicide, molybdenum silicide, tungsten silicide, titanium nitride, etc., that may be used with or in place of the titanium silicide layer 41, as long as the conductive barrier layer virtually prevents dopant migration and provides an electrical connection between the n-type and p-type regions. The titanium silicide layer 41 also provides an etch stop when etching the first insulating layer 44.

The load transistors 112 and 115 include laterally recessed channel regions 92. The laterally recessed channel regions 92 virtually undoped doping from the step of the forming of the source and drain regions for the load transistors 112 and 115. The lateral recessing is performed by isotropically etching the fast insulating layer openings 51 such that the third masking layer 50 is undercut. In general, the lower limit for the amount of lateral recession is determined by the thickness of the layer where the vertical transistor is formed times the sine of the greatest substrate tilt angle that actually occurs during the source/drain doping step. The first insulating layer 44 over the titanium silicide layer 41 is about 1.2 microns or about 12,000 angstroms. Although the substrate tilt angle for the source/drain doping is nominally set to zero degrees, the actual substrate tilt angle may be as high as ±0.5 degree. The lower limit of the lateral recession is:

12,000 angstroms.sine 0.5 degree=105 angstroms

The upper limit is typically determined by how far the dopant during this source/drain doping step diffuses beyond where the dopant is ion implanted. For example, if the thermal steps following the doping step cause the dopant to diffuse about 2000 angstroms, the upper limit for the lateral recession is about 2000 angstroms beyond the 105 angstroms of the ion implanting step or a total of about 2105 angstroms. The isotropic etch step when forming the first insulating layer opening for the load transistors may etch between about 105–2105 angstroms of the first insulating layer. In the previously described embodiment, the first insulating layer 44 is isotropically etched by about 200 angstroms and causes the channel regions of the load transistors to be recessed by about 200 angstroms, too. A smaller lateral recession is typically preferred, and therefore, the amount of isotropic etching is typically closer to the lower limit. One skilled in the art may adjust the amount of isotropic etching as the thickness of the first insulating layer, the maximum substrate tilt angle, and thermal cycles are changed. If the channel regions of the load transistors 112 and 115 were not laterally recessed, the channel regions of the load transistors 112 and 115 may receive a significant fraction of the source and drain doping that may significantly change the electrical characteristics of the load transistors 112 and 115.

The latch and load transistors are vertical transistors and have channel lengths that are determined in part by the depth of the trenches and openings, which are a function of the thickness of the layer in which the trenches or openings are formed. Planar transistors typically have channel lengths that are determined by lithographic patterns. Channel lengths for vertical transistors may be smaller and better controlled compared to planar transistors because a layer may have a thickness smaller than the resolution limit of the lithographic methods and thickness control is typically better than dimension control of lithographic patterns.

The previous description includes many processing details. One skilled in the art appreciates that many of the materials and thicknesses and other dimensions can be changed without deviated from the spirit or scope of the invention. The silicon layers or the silicon portion of the conductive members may include monocrystalline silicon, polycrystalline silicon, or amorphous silicon; the insulating layers may include silicon dioxide, silicon nitride, or silicon oxynitride; the gate dielectric layers may include silicon dioxide or silicon oxynitride; the contact plug may include tungsten, doped polysilicon, doped amorphous silicon, metals, metal alloys, or conductive metal nitrides; the interconnect members may include aluminum, copper, or gold; and the passivation layer may include oxynitride or a phosphorous doped glass. The masking layers may comprise different materials, but each masking layer must have a lower etch rate than the underlying layer. The following are just a few ranges of thicknesses and dimensions that may be used: the first silicon layer may be between 1.0–1.8 microns thick; the first conductive member width may be between 0.2–1.0 micron wide; the trenches may be between 1.2–2.0 microns deep; the second masking layer be between 1500–2000 angstroms thick; the third masking layer may be between 700–1000 angstroms thick; the first insulating layer may be between 1.0 and 1.4 angstroms thick; the second silicon layer may be between 400–500 angstroms thick; and the third gate dielectric layer may be between 100–300 angstroms thick. The list of materials, thicknesses and other dimensions are not intended to be exclusive or limiting.

Other embodiments may include additional variations. The memory cell may be formed using a monocrystalline silicon layer that lies over a substrate including silicon dioxide or sapphire. The dopant types may be reverse in that n-type doped layers and regions become p-type doped, and p-type doped layers and regions become n-type doped. The conductive members may be ion implanted, in-situ doped, or doped during a separate furnace doping step (different from a silicon deposition step), although in-situ doping is typically used to dope the conductive members that are formed within deep openings or trenches (greater than a couple thousand angstroms deep). In-situ doping of the conductive members may include phosphorus or arsenic. The ion implanting step of the second silicon layer 60 may be performed without rotating the substrate, or the substrate may be continuously rotated during the step. The trenches and first insulating layer openings may have shapes other than rectilinear shapes as shown in FIG. 2. The trenches or first insulating layer openings may be cylindrical in which case the trench or opening has only one wall.

Electrical parameters may be varied by changing thickness or doping parameters. Channel lengths of each vertical transistor are a function of the thickness of the first silicon layer 22 or the thickness of the first insulating layer 44 over the titanium silicide layer 41. The channel lengths of the transistors of the memory cell also depend on the temperature and time of thermal steps that the source regions and drain regions are exposed. The threshold voltages of the pass and latch transistors depend on the boron concentration of the first silicon layer 22 and the load transistors depend on the phosphorous concentration of the second silicon layer 60. The threshold voltages are also dependent on the thickness of the gate dielectric layers. One skilled in the art may vary the processing parameters to give desired electrical characteristics of the memory cell.

The trench depth may be adjusted without significantly adversely affecting device performance. The depth of the trench 32 of the previously described embodiment is about equivalent to the depth of the first silicon layer 22. The trench must at least contact the N+ buried layer 21. Therefore, the minimum trench depth is determined by how far the N+ buffed layer 21 extends into the first silicon layer 22. There is no known theoretical maximum trench depth limit, and trench 32 may extend completely through the N+ buffed layer 21. Therefore, at least a portion of the bottom or walls of the trench must contact part of the N+ buffed layer 21.

The memory cell described above may be formed as a discrete device or with other electrical devices of an integrated circuit. Other insulating layers, contact plugs, via plugs, or interconnect members may be required between third conductive members 90 and 91 and the passivation layer 102 to make proper electrical connections between the memory cell and other areas of the discrete device or integrated circuit. The electrical connecting requirements of the memory cell to other areas of the discrete device or integrated circuit may be done by one skilled in the art.

EXAMPLE 2

Figure 16:
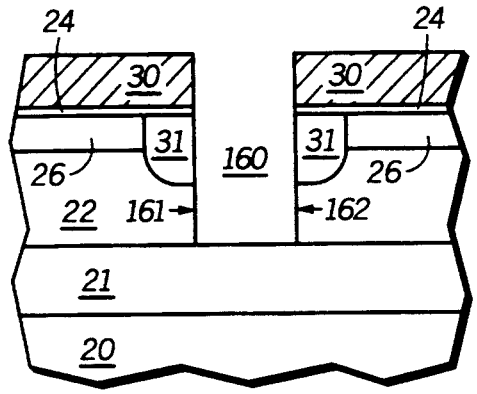
FIG. 16–20 include illustrations of cross sectional views of a semiconductor substrate at various process steps in forming a memory cell in accordance to another embodiment.

In another embodiment, modifications to Example 1 are presented to better illustrate method or device options available including a laterally recessed channel region of a silicon trench transistor, selection of an implant angle for an asymmetric trench, and forming a vertical transistor having both doped regions with graded diffusion junctions. The embodiment uses the substrate as described in Example 1 and is processed using the same steps up to and including the formation of the graded diffusion junctions 31. FIG. 5 includes an illustration of a cross sectional view of that portion of the substrate where one of the vertical n-channel transistors is formed and includes the silicon substrate 20, the N+ buried layer 21, the second silicon layer 22, the second doped region 26, the graded diffusion junction 31, the first gate dielectric layer 24, and the first masking layer 30. An asymmetric trench is formed during a two-step etch process. Referring to FIG. 16, the first step is performed to anisotropically etch through the graded junction 31 and the second silicon layer 22 to the N+ buffed layer 21 using conventional methods to form a trench 160 having a side 161 that is oriented along a <110> crystal direction of a (100) crystal plane and a side 162 that is oriented along a <100> crystal direction of the (100) crystal plane. Although the sides 161 and 162 may not be on opposite sides of the trench, the sides 161 and 162 are shown to be on opposite sides of the trench 160 for illustrative purposes.

Figure 17:
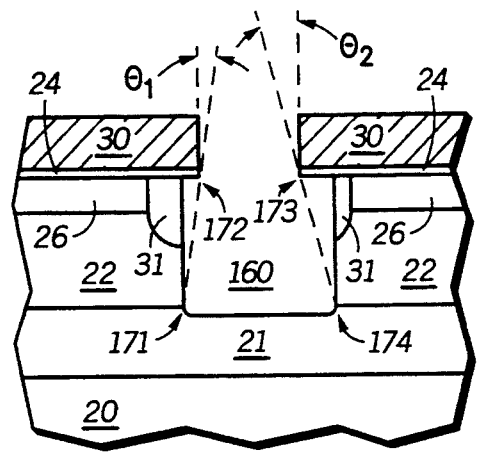

The second step is performed to laterally recess the second silicon layer 22 of the channel region 34 prior to forming a graded diffusion junction at the bottom of the trench. The second step uses a silicon etchant, such as potassium hydroxide, for example, that isotropically etches the first silicon layer 22. Because the sides 161 and 162 are along different crystal directions, they etch at different rates and form the asymmetric trench 160 as shown in FIG. 17. The etching time is selected such that about 0.17 micron of silicon is etched from side 161. Side 162 is etched further because the density of silicon atoms lying along that side is less than along side 161. Points 171 and 174 are locations where the second silicon layer 22 contacts the N+ buried layer 21 along the sides of the trench 160. Points 172 and 173 are locations along the edge of the first gate dielectric layer 24 that extends towards the lateral center of the opening through the dielectric layer 24. Points 171 and 172 form a line that makes an angle $\theta 1$ with respect to a direction that is generally normal to the surface of the substrate, and points 173 and 174 form a line that makes an angle $\theta 2$ with respect to a direction that is generally normal to the surface of the substrate. Angle $\theta 1$ is smaller than angle $\theta 2$ because the second step etched the side 161 at a slower rate compared to the side 162.

Figure 18:
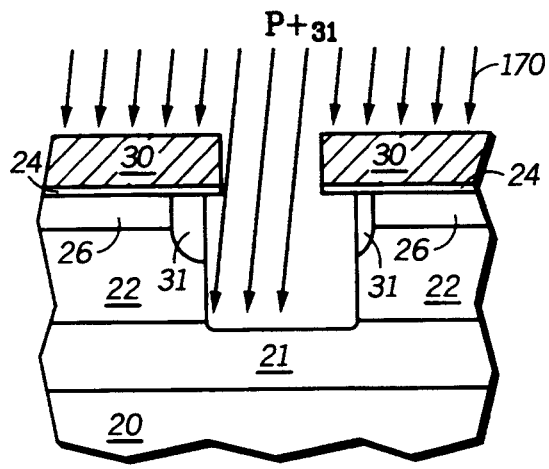
Figure 19:
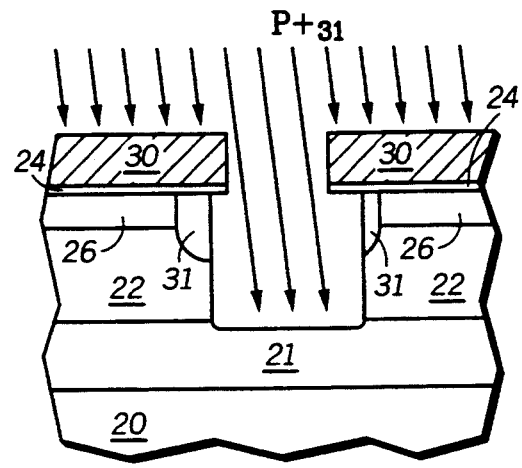

The substrate is ion implanted on a raster scanning ion implanter, such as an Extrion 350D ion implanter made by Varian Associates, for example. The substrate is ion implanted with phosphorous ions at a nominal substrate tilt angle of about seven degrees and an energy of about 40 kiloelectron volts to a dose of about 2E15 ions per square centimeter as shown in FIG. 18. Although the implant angle is set at about seven degrees in the center of the substrate, the raster scanning may cause an actual substrate tilt angle to be as low as four degrees or as high as ten degrees near the edge of the substrate. The amount of lateral recession is chosen such that virtually no ions are implanted into the sides 161 and 162 of the trench 160 above points 171 and 174. In general, the amount of lateral recession is about the thickness of the first silicon layer 22 above the N+ buried layer 21 (1.0 micron) times the sine of the greatest implant angle seen at the time of doping the bottom of the trench 160 (about ten degrees). For this example, the amount of lateral etching needs to be about 0.17 micron, which is approximately 1.0 micron times the sine of ten degrees. Virtually no doping occurs into the side 162 above point 174 because $\theta 2$ is larger than angle $\theta 1$. The substrate is ion implanted using the four quadrant method previously described. FIGS. 18 and 19 illustrate the ion implanting during the first and third segments, respectively.

Figure 20:
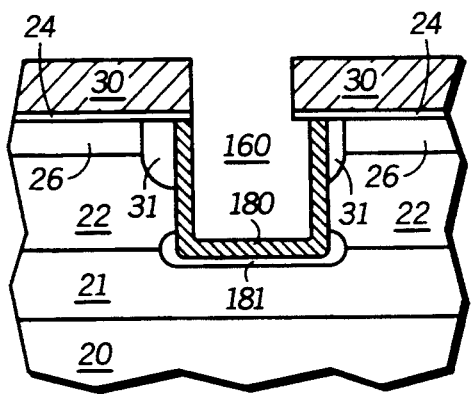

A first gate dielectric layer 180 about 120 angstroms thick is thermally grown along the sides 161 an 162 and bottom of the asymmetric trench 160 as shown in FIG. 20. The thermal oxidation also activates and diffuses the phosphorous dopant to form doped region 180. The combination of doped region 181 and the N+ buried layer 22 forms a graded diffusion junction along the sides of the asymmetric trench 160. The balance of the processing steps starting from the formation of the first conductive members uses the same processing steps as described using the embodiment of Example 1.

The embodiment described in this example forms a vertical transistor having an asymmetric trench with respect to the opening used to form the wench and graded diffusion junctions for both the source and drain regions of the vertical n-channel transistors. One skilled in the art appreciates that a vertical transistor having 1) a laterally recessed channel region, whether symmetric or asymmetric, or 2) a graded diffusion junction for the drain and/or source region may be used in virtually any type of semiconductor device that may use a vertical transistor. Although the embodiments described above form a memory cell, a vertical transistor having a laterally recessed channel region or a graded diffusion junction may also be used in forming a logic device, such as a microprocessor, for example.

As shown in FIGS. 6 and 20, graded diffusion junctions may be formed near the top and/or bottom of a trench for a vertical transistor. In a generic sense, a graded diffusion junction may be formed by doping regions adjacent to the top and/or bottom of the trench with two dopants with different diffusivities. The graded diffusion junction is formed by one of the dopants diffusing faster than the other.

In the foregoing specification, the invention has been described with reference to specific embodiments thereof. It will, however, be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A method of forming a static random access memory cell comprising the steps of:

forming a first doped region within a semiconductor substrate, wherein the first doped region has a first conductivity type and the substrate has a second conductivity type that is opposite the first conductivity type;

forming a first silicon layer over the first doped region, wherein:

the first silicon layer has the second conductivity type;

the first silicon layer has a first surface and a second surface that lie on an opposite side of the first silicon layer; and the first doped region lies adjacent the first surface;

forming a field isolation region adjacent to the second surface;

forming a first gate dielectric layer over the first silicon layer;

forming a first conductive member over the first gate dielectric layer and the field isolation region;

forming second and third doped regions within the first silicon layer adjacent the second surface and on opposite sides of the first conductive member to form pass transistors, wherein:
  the second and third doped regions have the first conductivity type; and
  each pass transistor includes a first channel region that lies within the first silicon layer adjacent the second surface and between the second and third doped regions;

forming a first patterned masking layer over the first silicon layer, wherein the first patterned masking layer has first masking layer openings that each overlies a portion of the second doped regions within the first silicon layer;

forming trenches, wherein each trench has a bottom, a top, and a wall, and extends through one of the second doped regions, extends through the first silicon layer and contacts the first doped region;

forming a second gate dielectric layer adjacent the walls and bottoms of the trenches;

patterning the first patterned masking layer to form a second patterned masking layer including second masking layer openings that each exposes portions of the second doped regions;

forming second conductive members adjacent portions of the second gate dielectric layer that lie along the walls of the trenches to form latch transistors, wherein:
  portions of the first doped region lie at the walls of the trenches and act as source regions for the latch transistors;
  portions of the first silicon layer lie at the walls of the trenches, overlie the portions of the first doped regions that lie at the walls of the trenches, and act as channel regions for the latch transistors;
  portions of the second doped regions lie at the walls of the trenches, overlie the portions of the first silicon layer that lie at the walls of the trenches, and act as drain regions for the latch transistors;

forming a patterned insulating layer over the first silicon layer and the second conductive members, wherein:
  the patterned insulating layer includes first insulating layer openings each having a bottom, a top, and a wall; and
  all of each first insulating layer opening overlies the first silicon layer and none of each first insulating layer opening overlies any of the trenches;

forming a second silicon layer having the first conductivity type along the bottoms and walls of the first insulating layer openings and over a portion of the patterned insulating layer;

selectively doping the second silicon layer to form:
  doped portions of the second silicon layer that lie along the bottom, near the top of each first insulating layer opening, and over the patterned insulating layer, wherein the doped portions have the second conductivity type; and
  wall portions of the second silicon layer lie along the walls and between the bottom and the top of each first insulating layer opening;

forming a third gate dielectric layer adjacent the second silicon layer;

patterning the patterned insulating layer for a second time to form second insulating layer openings, wherein each second insulating layer opening extends to one of the second conductive members; and forming third conductive members that are each adjacent that portion of the third gate dielectric layer lying within the first insulating layer openings to form load transistors, wherein:
  the doped portions of the second silicon layer that lie along the bottoms of the first insulating layer openings act as drain regions for the load transistors;
  the doped portions of the second silicon layer that overlie the tops of the first insulating layer openings act as source regions for the load transistors; and
  the wall portions of the second silicon layer act as channel regions for the load transistors.

2. The method of claim 1, wherein the step of forming the second conductive members comprises the steps of:
  depositing a doped silicon layer over the second patterned masking layer and within the first and second masking layer openings and within the trenches;
  forming a conductive barrier layer over the doped silicon layer, wherein the conductive barrier layer includes a material selected from a group consisting of titanium silicide, cobalt silicide, molybdenum silicide, tungsten silicide, and titanium nitride; and
  patterning the conductive barrier layer and the doped silicon layer to form the second conductive members.

3. The method of claim 1, wherein the step of forming the patterned insulating layer comprises the steps of:
  depositing an insulating layer over the second conductive members;
  forming a third masking layer including third masking layer openings that expose portions of the insulating layer over portions of the second conductive members
  selectively etching the insulating layer to form the patterned insulating layer including the first insulating layer openings, wherein the first insulating layer openings are wider than the third masking layer openings.

4. The method of claim 3, wherein:
  the substrate has a primary surface;
  each first insulating layer opening has a corresponding third masking layer opening that overlies that first insulating layer opening;
  the third masking layer has edges adjacent the third masking layer openings;
  each third masking layer opening includes a center such that a line through the center in a direction generally normal to the primary surface forms a lateral centerline;
  the step of patterning is performed such that a first point is formed within each insulating layer opening and is located where the wall and the bottom of that insulating layer opening meet;
  second points, wherein each second point is that point located on the edge of the masking layer adjacent each of the masking layer openings that is closest to the first point of the underlying first insulating layer opening; and each of the first points of the first insulating layer openings and each of the second points of the corresponding third masking layer openings form a line having an angle at least about 0.5 degrees as measured from the lateral centerline for that third masking layer opening.

5. The method of claim 1, wherein:

the pass transistors are planar n-channel field-effect transistors;

the latch transistors are vertical n-channel field-effect transistors;

the load transistors are vertical p-channel thin-film field-effect transistors, wherein the channel region comprises a material selected from the group consisting of polysilicon and amorphous silicon; and the channel regions of the latch transistors are formed at a different elevation compared to the channel regions of the load transistors.

6. A method of forming a vertical field-effect transistor comprising the steps of:

forming a first doped region within a semiconductor substrate, wherein:

the first doped region has a first conductivity type; and the substrate has a second conductivity type that is opposite the first conductivity type;

forming a silicon layer over the first doped region, wherein:

the silicon layer has a first surface and a second surface that lie on opposite sides of the silicon layer;

the first doped region is adjacent the first surface; and the silicon layer has the second conductivity type;

forming a second doped region within the silicon layer adjacent the second surface, wherein the second doped region has the first conductivity type;

forming a trench having a bottom, a top, and a wall such that the trench extends through the second doped region and contacts the first doped region;

forming a third doped region from a portion of the silicon layer adjacent the first doped region after forming the trench, wherein:

the third doped region has the first conductivity type;

a graded diffusion junction is formed at the wall and includes the first and third doped regions; and the graded diffusion junction lies along the wall of the trench;

forming a gate dielectric layer adjacent the wall and bottom of the trench; and forming a conductive member adjacent the gate dielectric layer that lies along the wall of the trench to form the vertical field-effect transistor having:

a graded diffusion junction lying at the wall adjacent the bottom of the trench; and a channel region formed along the wall of the trench and adjacent to the graded diffusion junction, wherein the channel region has the second conductivity type.

7. The method of claim 6, wherein:

the first and second doped regions both comprise arsenic;

the third doped region comprises phosphorus;

the silicon layer comprises boron; and the conductive member comprises n-type doped silicon.

8. The method of claim 1, further comprising the steps of:

doping the first silicon layer with a dopant having the first conductivity type, wherein, the step of doping is performed after the step of forming the first patterned masking layer; and annealing the substrate to activate and drive the dopant to form graded diffusion junctions.

9. The method of claim 8, wherein the first and second doped regions include arsenic and the dopant includes phosphorus.

10. The method of claim 8, wherein:

the first and second doped regions are doped with a dopant having a first diffusivity; and the third doped region is doped with a dopant having a second diffusivity that is greater than the first diffusivity.

11. A method of forming a vertical thin-film field-effect transistor comprising the steps of:

forming an insulating layer over a semiconductor substrate;

forming a patterned masking layer including a masking layer opening over the insulating layer, wherein the masking layer opening has a masking layer opening width;

patterning the insulating layer to form a patterned insulating layer including an insulating layer opening with a top, a bottom, and a wall, wherein the insulating layer opening underlies the masking layer opening and has an insulating layer opening width that is wider than the masking layer opening width;

forming a silicon layer having a first conductivity type over the patterned masking layer and along the bottom and wall of the insulating layer opening;

forming a gate dielectric layer adjacent to the silicon layer and including a portion of the silicon layer that lies within the insulating layer opening;

selectively doping the silicon layer to form top doped, bottom doped, and wall portions of the silicon layer, wherein:

the step of selectively doping is performed by ion implantation with a dopant having a second conductivity type that is opposite the first conductivity type;

the top doped portion lies near the top of the insulating layer opening;

the bottom doped portion lies along the bottom of the insulating layer opening;

the wall portion lies along the wall and between the top and bottom of the insulating layer Opening and is not doped during the step of selectively doping; and part of the top doped portion overlies the insulating layer opening and the bottom doped portion but does not overlie the wall portion; and forming a conductive member that is adjacent a portion of the gate dielectric layer within the insulating layer opening to form the vertical thin-film field-effect transistor, wherein the conductive member acts as a gate electrode for the vertical thin-film field-effect transistor and is formed after the step of selectively doping.

12. The method of claim 11, wherein:

the substrate has a primary surface;

the patterned masking layer has an edge adjacent the masking layer opening;

the masking layer opening includes a center such that a line through the center in a direction generally normal to the primary surface forms a lateral centerline;

the step of patterning is performed such that a first point is formed where the wall and the bottom of the insulating layer opening meet;

a second point is that point located on the edge of the masking layer adjacent the masking layer opening that is closest to the first point; and the first point and second point form a line having an angle at least about 0.5 degrees as measured from the lateral centerline.

13. The method of claim 11, wherein the step of patterning the insulating layer includes etching the insulating layer isotropically.

14. The method of claim 11, wherein the step of doping the silicon layer also dopes a portion of the silicon layer lying adjacent the top of the insulating layer opening.

15. The method of claim 11, wherein the patterned masking layer includes silicon.

16. The method of claim 11, wherein:

the step of patterning the insulating layer is performed such that the insulating layer opening overlies a part of the device, wherein the part is selected from a group consisting of a doped region lying within the substrate and a conductive member overlying the substrate; and the bottom doped portion of the silicon layer is electrically connected to the part.

17. The method of claim 1, wherein the step of forming the first doped region is performed such that the first doped region overlies only a portion of the substrate.

18. The method of claim 1, wherein the step of selectively doping the second silicon layer is performed such that:

top doped portions are the doped portions of the second silicon layer that lie adjacent to the top of the first insulating layer openings;

bottom doped portions are the doped portions of the second silicon layer that lie adjacent to the bottom of the first insulating layer openings; and parts of the top doped portions overlie the first insulating layer openings and the bottom doped portions but do not overlie the undoped portions of the second silicon layer.

19. The method of claim 3, wherein the third masking layer includes silicon, and wherein the step of forming the second silicon layer is performed such that the second silicon layer overlies the third masking layer.

20. The method of claim 4, wherein, for each of the first insulating layer openings, parts of the doped portions of the second silicon layer lying adjacent to the top and bottom of one of the first insulating layer openings lie closer to the lateral centerline compared to all of the wall portion of the second silicon layer lying within that same first insulating layer opening.

* * * * *